US 6,618,298 B2

(12) United States Patent
Honma et al.

(10) Patent No.: US 6,618,298 B2
(45) Date of Patent: Sep. 9, 2003

(54) SEMICONDUCTOR MEMORY DEVICE

(75) Inventors: Kazuki Honma, Kodaira (JP); Masashi Wada, Kodaira (JP); Shuichi Kuwahara, Akita (JP)

(73) Assignees: Hitachi, Ltd., Tokyo (JP); Akita Electronics Co., Ltd., Akita (JP)

( * ) Notice: Subject to any disclaimer, the term of this patent is extended or adjusted under 35 U.S.C. 154(b) by 0 days.

(21) Appl. No.: 10/144,036

(22) Filed: May 14, 2002

(65) Prior Publication Data
US 2002/0196672 A1 Dec. 26, 2002

(30) Foreign Application Priority Data
Jun. 20, 2001 (JP) ........................................ 2001-185933

(51) Int. Cl.⁷ ................................................ G11C 7/00
(52) U.S. Cl. .............. 365/189.11; 365/201; 365/189.09
(58) Field of Search ............................ 365/189.11, 201, 365/189.09, 189.01, 177

(56) References Cited

U.S. PATENT DOCUMENTS 6,169,694 B1 * 1/2001 Nam et al. ................... 365/201

* cited by examiner

Primary Examiner—David Lam
(74) Attorney, Agent, or Firm—Miles & Stockbridge P.C.

(57) ABSTRACT

The semiconductor memory device of the present invention is provided with a switching element comprised of a single channel MOS transistor at a halfway of a path used to transmit a high voltage supplied to the memory array via the external terminal at the time of a test performance, so that the switching element is turned off when a word line is changed to another, thereby resetting of the supply voltage having been required conventionally for each test performance is omitted.

10 Claims, 5 Drawing Sheets

SEMICONDUCTOR MEMORY DEVICE

BACKGROUND OF THE INVENTION

The present invention relates to a technique effective specially for controlling switching of a voltage at the time of a test performed for a semiconductor memory in/from which information can be written/erased electrically. More particularly, the present invention relates to a technique to be employed effectively for flash memories.

A flash memory employs non-volatile elements as its memory cells, each of which is comprised of a MOSFET with a double gate structure having a control gate and a floating gate. The flash memory stores information by changing the amount of the charge accumulated in the floating gate of the MOSFET, thereby switching the threshold voltage in the MOSFET between high and low states.

In a flash memory, the threshold voltages in the memory cells are distributed within a certain range after data is written or erased in/from them, since the threshold voltage is varied not only among memory cells, but also in a single memory cell after such the writing/erasing. Generally, a flash memory is provided with a power supply circuit that includes a step-up circuit and configured so as to generate a high voltage required for writing and erasing. This is why the writing voltage and the erasing voltage generated by the power supply circuit come to be varied among chips and this voltage variation causes the threshold voltage to be varied among memory cells in each chip.

In order to avoid such the problem, each chip is checked for defect/reliable, as well as for the performance by checking how the threshold voltages in memory cells are changed, that is, how they are distributed in a test mode after data is written/erased in/from those memory cells. To make it possible to perform such a test (hereinafter, to be referred to as a threshold voltage distribution test), each chip is usually configured so as to enable data to be read from a word line after a desired voltage is applied to the word line from an external tester.

SUMMARY OF THE INVENTION

In such a threshold voltage distribution test, a selected word line must be changed to another to detect the threshold voltage in every memory cell in the object memory array. In addition, a decoder circuit must be driven to apply a voltage to a desired word line from the tester. In the case where the decoder circuit is driven while a high voltage is applied to a word line from the tester at this time, the MOSFETs, which compose the driver circuit and the power supply circuit of the word line, are switched over while a high voltage is applied to them, thereby a drain current flows in them. Consequently, a problem such as element degradation might arise. To avoid such the problem, therefore, in a threshold voltage distribution test for a conventional flash memory, the conventional tester has been configured so as to lower the voltage supply at the tester side to the Vcc once when a word line is changed to another (hereinafter, this operation is referred to as a voltage reset operation).

As a result, the word line change takes much time, causing the test time to be extended. In addition, the tester is required to reset the voltage at each word line change, thereby the tester load has increased. This has also been a problem.

Under such circumstances, it is an object of the present invention to shorten the test time and reduce the load of the tester without changing the voltage supplied from the tester during a test performance for respective semiconductor memory devices provided with a switch enabled to turn on/off the voltage supplied to an external terminal and transmitted to the memory array at the time of a test and enabled to use a voltage supplied from an external device for the test.

It is another object of the present invention to omit changes of a voltage supplied from the tester at each word line change in a threshold voltage distribution test performance for respective semiconductor memory devices provided with memory cells, each being enabled to store information therein according to the high/low state of the threshold voltage, thereby the test time is shortened and the load of the tester is reduced.

The above and further objects, as well as novel features of the present invention will be apparent from the description and the accompanying drawings in this specification.

Hereinafter, the typical one of the present invention objects disclosed in this specification will be briefly described.

In such a semiconductor memory device as a flash memory, a switching element comprised of a single channel MOS transistor is provided at a halfway of a path that transmits a voltage supplied from an external terminal to a memory array at the time of a test performance.

Concretely, in a semiconductor memory device provided with a memory array consisting of a plurality of memory cells, a plurality of selection lines connected to selection terminals of a plurality of memory cells disposed in a first direction, and a plurality of signal lines connected to data input/output terminals of a plurality of memory cells disposed in a second direction and formed as a semiconductor integrated circuit on a semiconductor chip, the semiconductor chip is provided with an external terminal enabled to supply a first voltage to the memory array at the time of a test performance in addition to a power supply terminal to which a supply voltage required for driving all the circuits formed on the chip is supplied, the first voltage being different from the supply voltage. A first switching element comprised of an N-channel or P-channel MOS transistor is provided at a halfway of a path that transmits the first voltage from the external terminal to the memory array.

According to the above described means, the switching element is turned off to shut off the voltage to be supplied to the memory array, thereby there is no need to change the voltage at each test performance. Consequently, the test time is shortened and the load of the tester is reduced.

At this time, the first voltage supplied to the memory array from outside the semiconductor chip at the time of a test performance may be supplied to any of the selection lines and the signal lines.

Each of the above described memory cells is comprised of a non-volatile memory element enabled to store information according to the high/low state of its threshold voltage. In a semiconductor memory device comprised of such non-volatile memory elements, a test performance is required to detect the distribution of the threshold voltages in the memory elements by varying the voltage applied to a word line to read data from each memory cell connected to the word line. And, the present invention has successfully eliminated such the resetting of the voltage that has been required conventionally at each word line change for this test performance. This is why the test time is shortened and the load of the tester is reduced.

Furthermore, the above described memory cells are all enabled to be written information electrically and the above described semiconductor chip is provided with a voltage generator that generates a second voltage, which is different from the supply voltage. The second voltage generated by the voltage generator is transmitted to the memory array when information is written therein. And, a second switching element is provided at a halfway of a path that transmits the second voltage to the memory array. Consequently, when the semiconductor chip is configured so that both of the first and second voltages are supplied to the memory array through a common path, it is possible to avoid transmission of the first voltage to the voltage generator while the first switching element is turned on. The first voltage supplied to the external terminal is thus supplied to the memory array.

The semiconductor chip is also provided with a third switching element enabled to supply the supply voltage to the memory array instead of the first voltage when the first switching element is turned off and the second switching element is turned on. Consequently, the supply voltage can be supplied to the memory array via the same path only by switching the switching element when the first switching element is turned off.

Furthermore, the semiconductor memory device is provided with switching means that stops the operation of the voltage generator or shuts off the voltage output from the voltage generator when the third switching element is turned on. Consequently, it is possible to easily avoid the influence of the voltage generated by the voltage generator when the third switching element is turned on to supply the supply voltage to the memory array.

Furthermore, the external terminal that can supply the first voltage, which is different from the above described supply voltage, is enabled to output a signal denoting that the subject chip is ready to accept an access from external. This signal is used less than other signals, so the external terminal can also be used to supply the first voltage so as to reduce the number of terminals of the chip.

Furthermore, the first switching element is comprised of a MOS transistor structured so as to withstand high breakdown voltages. Consequently, it is possible to prevent the first switching element from characteristic degradation. The first switching element is used to shut off the first voltage supplied from external when the voltage is comparatively high.

DETAILED DESCRIPTION OF THE PREFERRED EMBODIMENTS

Hereunder, a preferred embodiment of the present invention will be described with reference to the accompanying drawings.

Figure 1:
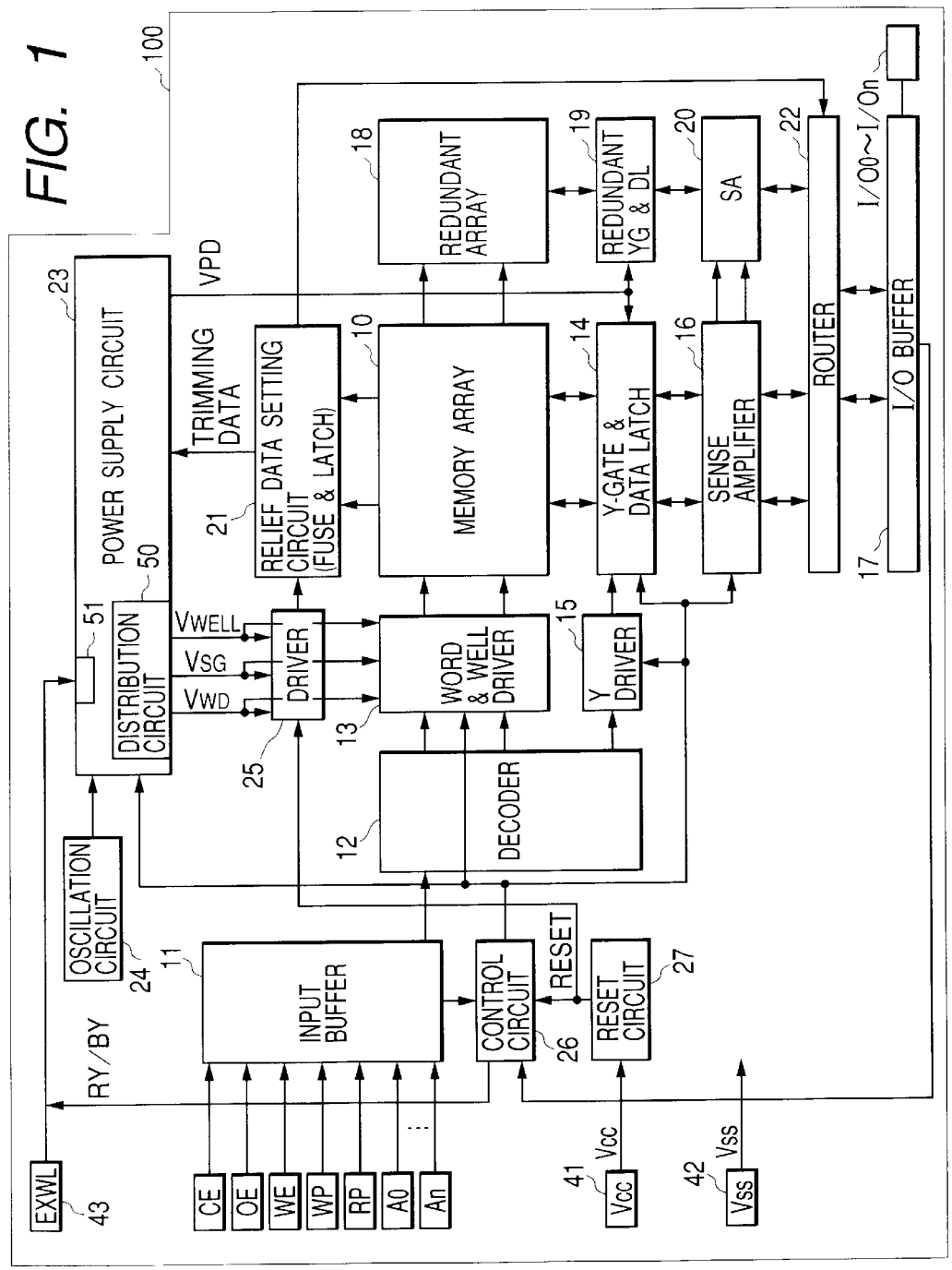
FIG. 1 is a block diagram showing an embodiment of a flash memory as one example of a semiconductor memory device effective for applying to the present invention.

FIG. 1 shows a block diagram of a non-volatile semiconductor memory device employed as a flash memory in an embodiment of the present invention. Although not limited specially, the flash memory in this embodiment is formed on one semiconductor chip 100 made of, for example, single crystal silicon.

In FIG. 1, reference numeral 10 denotes a memory array in which memory cells are disposed like a matrix. Each of the memory cells is comprised of a MOSFET with a double-gate structure having a floating gate and a control gate. The control gates of the memory cells disposed in the same row are formed consecutively as a word line used as a selection line. The drain terminals of the memory cells disposed in the same column function as data input/output terminals connected to a bit line used as a signal line.

Reference numeral 11 denotes an input buffer circuit that fetches control and address signals supplied from outside of the chip. Reference numeral 12 denotes a decoder circuit that decodes address signals fetched by the input buffer 11. Reference numeral 13 denotes a word & well driver circuit that drives a word line in the memory array to a selection level according to the decoding result in the decoder circuit 12 and applies a predetermined voltage to a well comprised of a plurality of memory cells according to the operation mode and/or a received address. This word & well driver circuit 13, when the memory array is configured so that a column-wise bit line is divided into a plurality of sub-bit lines and the sub-bit lines are connected to the main bit line via a switching MOSFET referred to as a second gate, is configured to generate a voltage for controlling the second gate.

In FIG. 1, reference numeral 14 denotes a Y gate & data latch circuit that selects a bit line in the memory array 10 and holds write and read data. Reference numeral 15 denotes a Y driver circuit that controls the Y gate in the Y gate & data latch circuit 14 according to the result of decoding in the decoder circuit 12. Reference numeral 16 denotes a sense amplifier circuit that amplifies data signals read from the memory array 10 via a bit line. Reference numeral 17 denotes an input/output buffer circuit that fetches write data to be supplied from outside of the chip and outputs data read from the memory array 10 to external.

Furthermore, reference numeral 18 denotes a redundant memory array and reference numeral 19 denotes a redundant Y gate & data latch circuit that selects a bit line in the redundant memory array 18 and holds write and read data. Reference numeral 20 denotes a redundant sense amplifier circuit that amplifies data signals read from the redundant memory array 18 via a bit line. Reference numeral 21 denotes a relief data setting circuit that includes a fuse used to set relief data for replacing a memory column in the memory array 10 with a memory column in the redundant memory array 18, as well as trimming data of an internal power source, and a latch circuit used to hold the data set in the fuse, etc. Reference numeral 22 denotes a router circuit that switches among signal paths from the input/output buffer circuit 17 to the sense amplifier circuit 16 and to the redundant sense amplifier circuit 20 according to the relief data set in this relief data setting circuit 21.

Although not limited specially, the relief data setting circuit 21 is comprised of non-volatile memory cells structured in the same way as the memory cells of the memory array 10. Reference numeral 23 denotes a power supply circuit that includes such a step-up circuit as a charge pump that generates a high voltage used to write/erase data. Reference numeral 24 denotes an oscillation circuit that generates a clock signal required to drive the step-up circuit. Reference numeral 25 denotes a driver circuit that writes data in the relief data setting circuit 21 according to the voltage generated by the power supply circuit 23.

Although not limited specially, the flash memory in this embodiment is provided with a control circuit (state machine) 26 that interprets commands (instructions) received from such a controller as an external microprocessor, a flash controller, etc. into control signals used for each circuit in the memory sequentially to execute a processing corresponding to each command. Receiving a command, the flash memory generates an internal control signal according to the command and execute the corresponding processing automatically.

The control circuit 26 may be provided with, for example, a ROM (Read Only Memory) 31 that stores a series of micro instructions used, for example, to execute a command and executes those micro instructions sequentially to form a control signal for each circuit in the chip. In addition, the control circuit 26 is provided with a status register that denotes its internal status. The flash memory in this embodiment is also provided with a reset circuit 27 that detects the rising of the supply voltage Vcc supplied from external to generate an internal reset signal RES.

The power supply circuit 23 is comprised of a charge pump that generates high positive and negative voltages by stepping up the supply voltage Vcc supplied from external; a constant circuit and a voltage divider circuit that generate voltages such as a write voltage, an erase voltage, a read voltage, a verify voltage, etc. required inside the chip; a reference voltage generator circuit that generates a reference voltage required for the constant voltage circuit, etc.; a voltage switch/distribution circuit that selects a desired voltage from among those voltages according to the memory operation state to supply it to the memory array 10 via the word & well driver circuit 13; and a power supply control circuit that controls those circuits. In FIG. 1, reference numeral 41 denotes a supply voltage terminal to which the supply voltage Vss is supplied. The Vcc is required to operate the whole chip during a normal operation and during a test performance. Reference numeral 42 denotes a supply voltage terminal (ground terminal) to which the ground potential Vss is applied.

Control signals inputted to the flash memory from an external CPU, etc. in this embodiment are, for example, a chip enable signal CE, an output enable signal OE, a write enable signal WE, a write prohibit signal WP, a reset signal RP, etc. Those control signals and address signals are fetched into the input buffer circuit 11 according to the chip enable signal CE and the write control signal WE. On the other hand, write data, as well as commands issued to the control circuit 26 are fetched into the input/output buffer circuit 17 according to the chip enable signal CE and the write control signal WE.

Furthermore, in this embodiment, according to a predetermined bit in the status register that denotes the internal state in the memory, the ready/busy signal RY/BY is output to external via the external terminal 43. The signal RY/BY denotes whether or not the flash memory is ready to accept an access from external. In this flash memory in this embodiment, a high voltage EXWL is supplied to the power supply circuit 23 from external via this external terminal at the time of a test performance.

Figure 2:
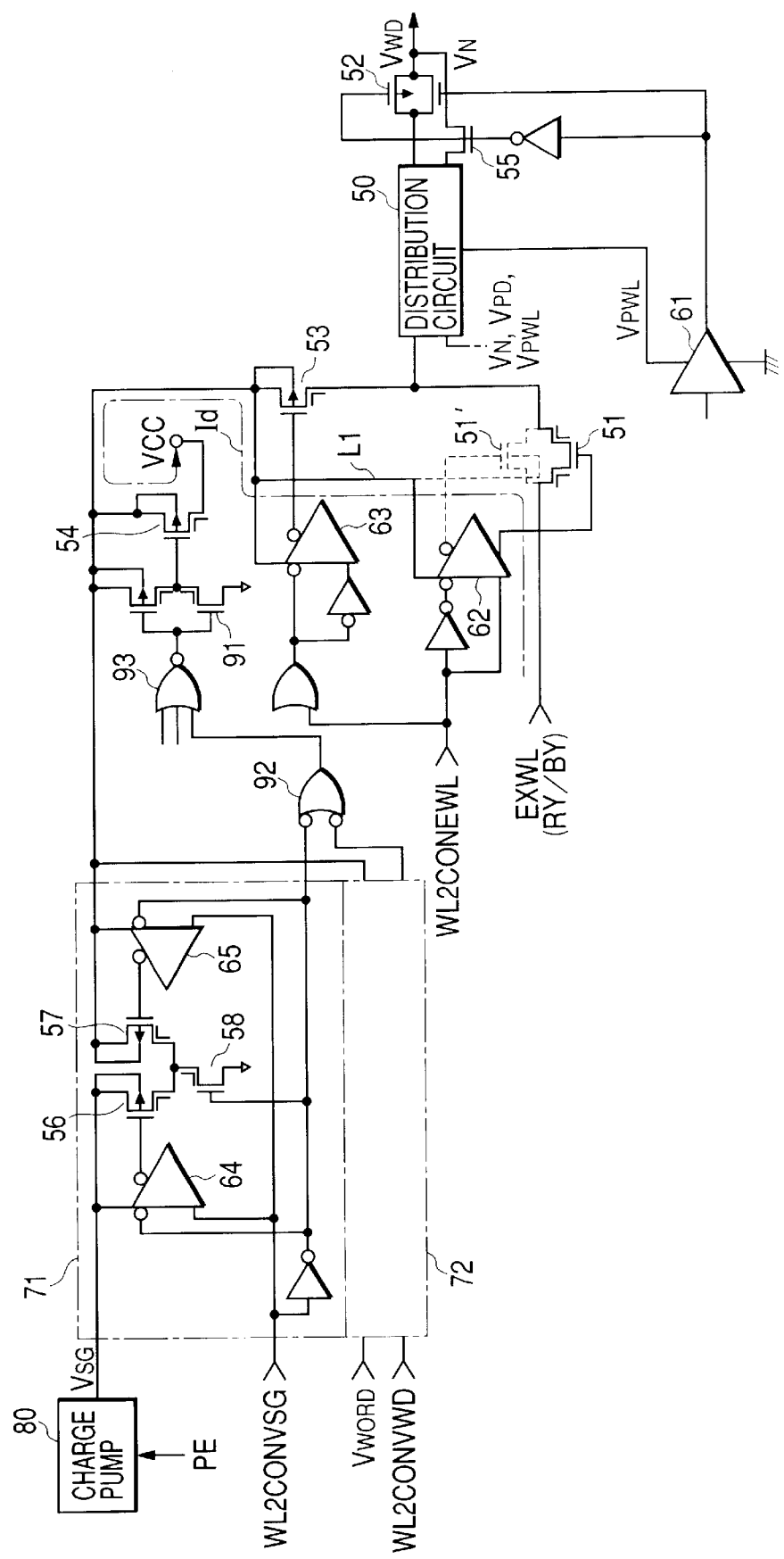
FIG. 2 is a circuit configuration for a combination of a switch used to transmit an external voltage to a memory array, as well as a control circuit and a power supply circuit of the switch.

FIG. 2 shows a relationship between the configuration of the power supply circuit 23 and a switch that transmits/shuts off the high voltage EXWL supplied to the word line. The EXWL is used to check the threshold voltage applied to the terminal 43 from an external tester in a test mode.

In FIG. 2, reference numeral 51 denotes a switch MOSFET that transmits/shuts off the high voltage EXWL and this switch MOSFET 51 is turned on to transmit the high voltage EXWL to be supplied to the word line driver (denoted by reference numeral 13a in FIG. 6) via the CMOS switch 52 controlled by the voltage switch/distribution circuit 50 and a level shifter 61 of the decoder 13. In FIG. 1, the CMOS switch 52 may be supposed to be provided in the word & well driver circuit 13.

The switch MOSFET 51 is turned on/off by the level shifter 62 that shifts the level of the control signal WLCONNEXWL supplied from the control circuit 26. The voltage switch/distribution circuit 50 switches among stepped-up voltages generated by another charge pump of the power supply circuit 23 and/or among the voltages divided by the voltage dividing circuit. The circuit 50 also distributes those voltages to such circuits as the word line driver, the well driver, etc. as needed. In addition, the voltage VN, which is included in the voltages to be distributed, is supplied to the word driver (13a) via the switch MOSFET 55 that is turned on/off by a level shifter 62.

In FIG. 2, reference numeral 53 denotes a switch MOSFET that supplies/shuts off the supply voltage Vcc and a predetermined voltage generated by the power supply circuit 23 in normal operation time to/from the voltage switch/distribution circuit 50. The switch MOSFET 53 is turned on/off by the level shifter 63 that shifts the level of the control signal WLCONNEXL supplied from the control circuit 26. However, the switch MOSFET 53 is controlled by the level shifter 63 complementarily with respect to the switch MOSFET 51. In other words, the switch MOSFET 53 is turned off when the switch MOSFET 51 is on and turned on when the switch MOSFET 51 is off. The switch MOSFET 53 transmits/shuts off the supply voltage Vcc supplied via the switch MOSFET 54 or the high voltage VSG supplied from the charge pump 80 via the switch circuit 71. This switch MOSFET 53 can be regarded as a switch included in the voltage switch/distribution circuit 50.

Instead of the high voltage VSG, the high voltage VWORD supplied from the switch circuit 72 is supplied to the switch MOSFET 53 in normal operation. This high voltage VWORD is also generated by a charge pump (not shown). Selection of the high voltage VSG or VWORD is decided by the switch circuit 71/72 to be turned on by the control signal WL2CONVSG/WL2CONVWD supplied from the control circuit 26. In addition, when in a test of threshold voltage distribution, the level shifters 62 and 63 are driven by the high voltage VSG generated by the charge pump 80. Consequently, the high voltage VSG is assumed to be higher than the voltage EXWL supplied from external by the threshold voltage of the MOSFET or over.

The switch circuits 71 and 72 can shut off voltages of the charge pump 80 and the switch 53 regardless of the voltage that rises in any of the charge pump 80 and the switch 53. For example, if the switch circuit 72 is turned on while the switch circuit 71 is off, the high voltage VWORD is supplied. At this time, however, transmission of the high voltage VWORD to the charge pump 80 stops. This is because the switch circuit 71 is comprised of switch MOSFETs 56 and 57 connected serially between the charge pump 80 and the switch MOSFET 53, level shifters 64 and 65 that control those switch MOSFETs, and a switch MOSFET 58 that fixes the intermediate node at the ground potential while the switch MOSFETs 56 and 57 are off. The switch circuit 72 is also composed similarly. The operation of the charge pump 80 is controlled by the control signal PE supplied from the control circuit 26.

The switch MOSFET 54 is turned on by an inverter 91 to supply the supply voltage Vcc to the switch MOSFET 53 while both of the switch circuits 71 and 72 are turned off by the control signals WL2CONVSG and WL2CONVWD. The inverter 91 that controls the switch MOSFET 54 inverts signals output from a NOR gate 93 that receives signals from an OR gate 92, as well as another control signals and applies those inverted signals to the gate terminal of the switch MOSFET 54. The OR gate 92 receives control signals WL2CONVSG and WL2CONVWD. The inverter 91 turns off the switch MOSFET 54 to shut off the supply voltage Vcc when either of the switch circuit 71 or 72 is ready to transmit a voltage.

In the power supply circuit in this embodiment, while either of the switch circuit 71 or 72 is ready to transmit a voltage, the transmitted high voltage is supplied to the power supply terminals of the level shifter 62 and 63. The level shifters 62 and 63 are then driven by the high voltages to turn on/off the switch MOSFETs 51 and 53 surely. In the case where both of the switch circuits 71 and 72 are turned off temporarily and the switch MOSFET 54 is turned on, thereby the supply voltage Vcc is supplied to the switch MOSFET 53 at a word line change in a memory cell threshold voltage distribution test, both of the level shifters 62 and 63 are driven by the supply voltage Vcc.

Figure 3:
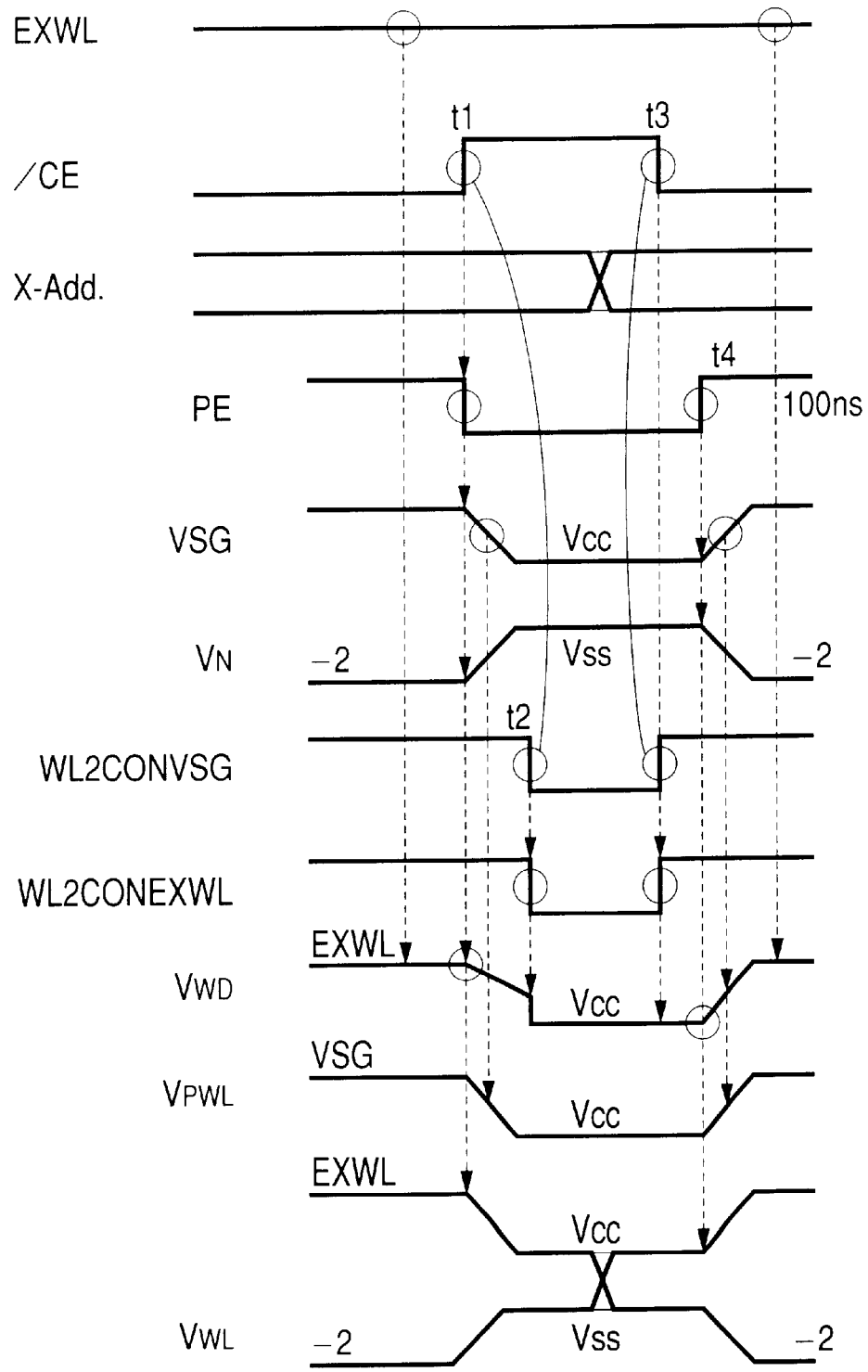
FIG. 3 is a timing chart showing each signal timing in the circuits of FIG. 2.

Next, a description will be made for the operation of the circuit shown in FIG. 2 at a word line change in a threshold voltage distribution test with reference to the timing chart shown in FIG. 3. Although not limited specially, this threshold voltage distribution test begins when a test mode start command is supplied from the tester to the control circuit 26 via a data input/output terminal (I/O0 to I/On).

While the test is performed, the control signals WL2CONVSG and WL2CONVWD output from the control circuit 26 are set in the high level respectively. Consequently, the switch MOSFET 51 is turned on, the switch MOSFET 53 is turned off, and the high voltage EXWL applied to the external terminal 43 is supplied to the word line driver (denoted by 13a in FIG. 6) and the potential VWD of the selected word line is set at the external voltage EXWL. When a word line is changed to another, at first the chip enable signal /CE is driven into the high level (at the timing t1) by the external tester. Then, the control signal PE output from the control circuit 26 is driven into the low level, thereby the operation of the charge pump 80 stops. Another charge pump (not shown) also stops at this time. Consequently, the levels of the stepped-up voltages VSG and VPW generated by the charge pumps are lowered to Vcc and the voltage VWD supplied to a word line from the circuit shown in FIG. 2 and the potential VWL of the selected word line are also lowered step by step from the external voltage EXWL.

After this, the control signals WL2CONVSG and WL2CONVWD output from the control circuit are driven into the low level respectively due to the level change (from Low to High) of the chip enable signal CE (timing t2). Then, the switch MOSFET 51 and the switch circuit 71 are turned off (the switch circuit is already off) and the switch MOS-FETs 53 54 are turned on, thereby the supply voltage Vcc is supplied to the word line driver and the selected word line potential VWD is set to Vcc. Then, the address signal X-Add is changed to another during that time, thereby the word line is changed to another.

After this, the chip enable signal CE is driven into the low level, the control signals WL2CONVSG and WL2CONVWD output from the control circuit 26 are driven into the high level (timing t3). Consequently, the switch MOSFET 51 and the switch circuit 71 are turned on and the switch MOSFETs 53 and 54 are turned off, thereby the voltage VSG (Vcc at the first) output from the charge pump 80 comes to be supplied to the word line driver.

After this, the control signal PE is driven into the high level, thereby the charge pump 80 steps up the voltage (timing t4). The voltage VSG goes up step by step and the voltage VWD supplied to a word line from the power supply circuit 23 and the potential VWL of the word line rise. At this time, the charge pump (not shown) that generates the supply voltage VPWL for the decoder driver 61 also begins stepping up the voltage VPWL, thereby the VPWL also rises step by step. At this time, a negative voltage such as −2V is supplied to non-selected word lines. In the above embodiment, while the charge pump 80 stops at a word line change, the switch circuit 71 shuts off the voltage output from the charge pump 80. There is no need to stop the operation of the charge pump at this time.

As described above, in the power supply circuit in this embodiment, there is no need to reset the high voltage EXWL applied from external to the Vcc terminal at a word line change in a threshold voltage test. Consequently, the changeover time can be reduced by the omission of the resetting. Although this time reduction is not so much in one change-over operation, the total test time reduction becomes significant, since such the word line changes are done in accordance with the number of the word lines in the memory array and the voltage EXWL is changed step by step to read data repeatedly in a threshold voltage test. In addition, because the tester is not required to reset the voltage EXWL, the load of the tester is also reduced. And, the reason why there is no need to reset the voltage EXWL by the tester is as follows.

Because, a switch (51) comprised of only an N-channel MOSFET is used to transmit/shut off the high voltage EXWL supplied from the tester in this embodiment while generally a CMOS switch comprised of a P-channel MOSFET or both of a P-channel MOSFET and an N-channel MOSFET connected in parallel is used so as to prevent the potential of the switch from falling.

If a P-channel MOSFET 51' is used instead of the switch MOSFET 51 or disposed in parallel to the switch MOSFET 51 as shown with a dotted line in FIG. 2, the step-up voltage VSG is applied to the N-well of this P-channel MOSFET 51' via a line L1 so as to bias the PN junction in reverse. Consequently, when the switch MOSFET 53 and the switch circuit 71 are turned off, the high voltage EXWL of the external terminal 43 is supplied to the N-well from this P-channel MOSFET 51' source, then to N-well of the switch MOSFET 54 via the line L1 that is in the floating state. After this, when the switch MOSFET 54 is turned on/off due to the word line change while this high voltage EXWL is applied thereto, the drain current comes to flow into the MOSFET 54, thereby the breakdown voltage falls.

Figure 4:
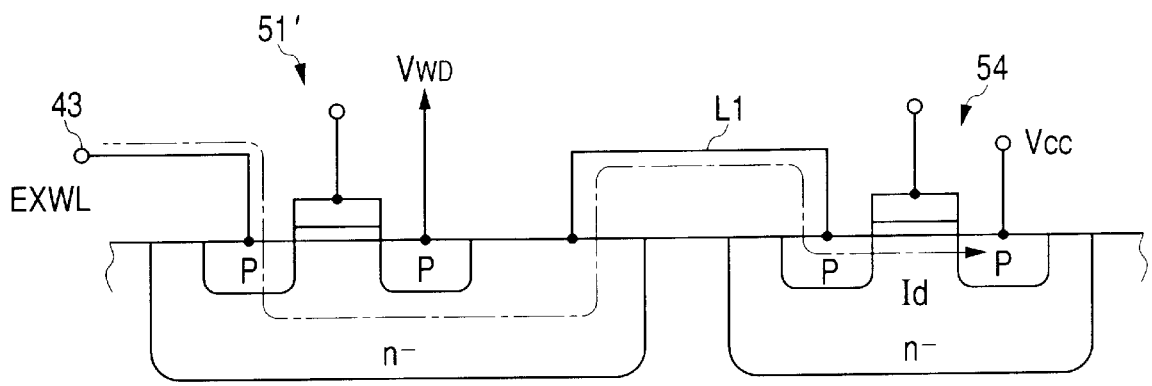
FIG. 4 is a cross sectional view of structures of a switching element used to transmit the external voltage and a switching element used to transmit a supply voltage, as well as a path of a leak current in the flash memory of the embodiment.

FIG. 4 shows a cross sectional view of the virtual P-channel MOSFET 51' disposed in parallel to the switch MOSFET 51, as well as that of the switch MOSFET 54. In FIG. 4, an alternate long and short dash line denotes a path of the current flowing due to the change of a word line to another. In a circuit in which the P-channel MOSFET is not provided in parallel to the switch MOSFET 51, the drain current that flows in the switch MOSFET 54 can be shut off. As a result, the switch MOSFETs 51 and 54 are turned on while the voltage EXWL supplied from the tester is kept applied to the Vcc, thereby the supply voltage Vcc can be supplied to the word line driver. The switch MOSFET 51 is structured so as to withstand high voltages.

Figure 5:
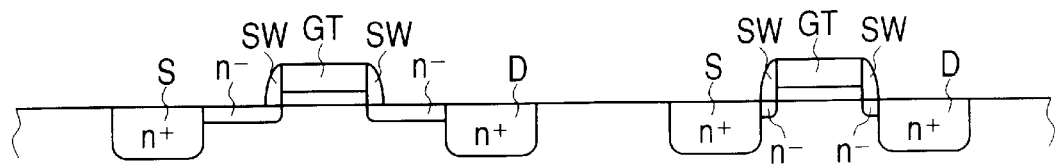
FIG. 5 is a cross sectional view of structures of a high breakdown voltage switch MOSFET used for the flash memory of the embodiment, as well as a structure of an ordinary MOSFET.

FIG. 5 shows structures of a high breakdown voltage MOSFET and an ordinary MOSFET used in this embodiment. In FIG. 5, the high breakdown voltage MOSFET is shown at the left side and the ordinary MOSFET is shown at the right side. The ordinary MOSFET is used to compose the control circuit 26, etc. that do not require a high voltage. Unlike the ordinary MOSFET, the source region S and drain region D of the high breakdown voltage MOSFET are separated from the gate electrode GT so that a low density N-type region n− is formed between each of the source and drain regions and the gate electrode GT.

In the high breakdown voltage MOSFET, ion injection is done after a wide mask is formed so as to cover both of the gate electrode GT and the side wall SW when high density source and drain regions S and D are formed after side walls SW are formed at both sides of the gate electrode, although such the side walls are used as a mask for ion injection in ordinary MOSFETs. Therefore, a low density N-type region n-longer than that of the ordinary MOSFETs is formed between each of the source and drain regions S and D and the gate electrode GT. The MOSFETs used to compose the switch MOSFET 54 and the inverter 91 shown in FIG. 2 are structured to withstand high voltages at one side where a wide low density N-type region n− is formed between one side of the gate electrode, that is, the source region or the drain region and itself.

Figure 6:
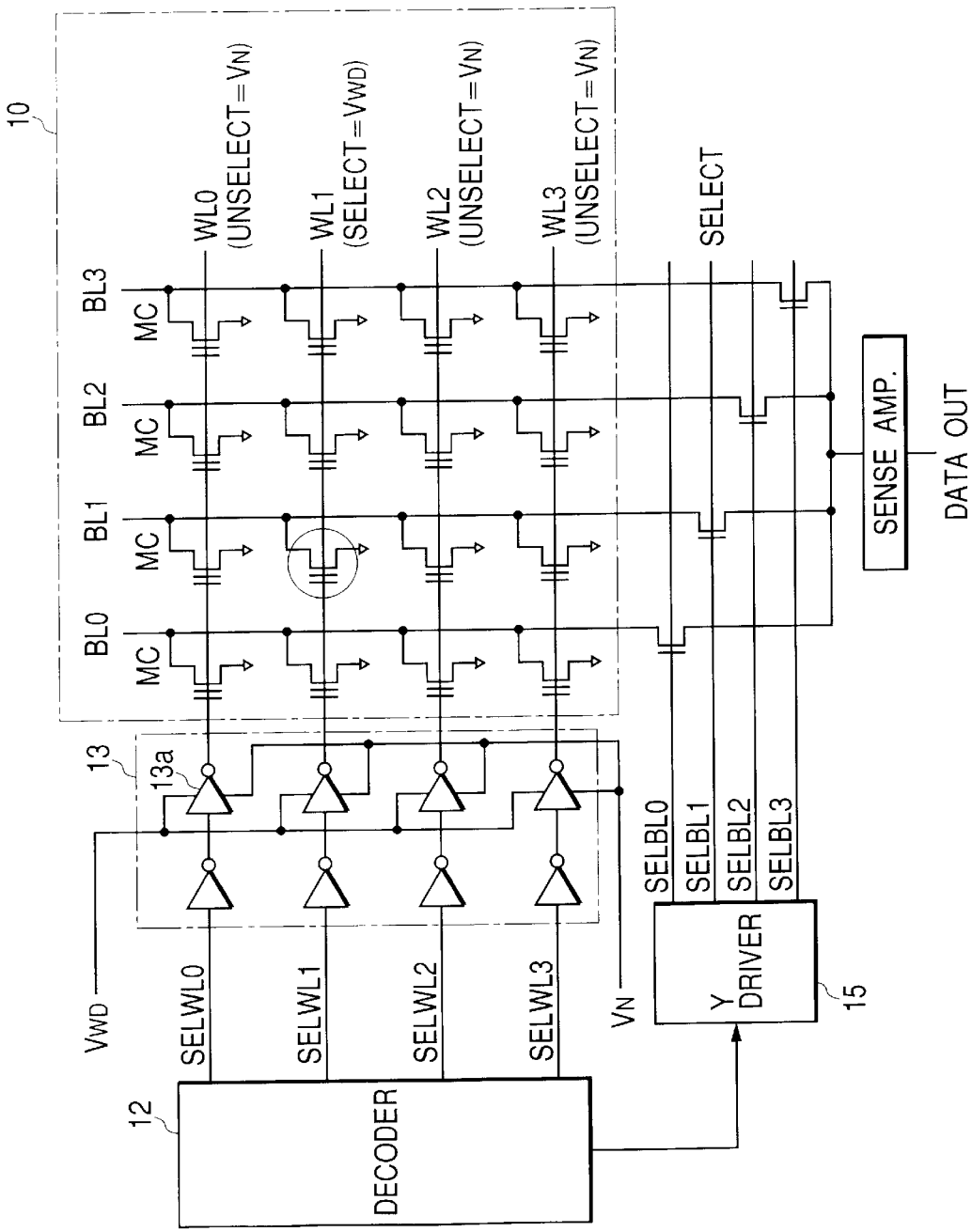
FIG. 6 shows a schematic circuit diagram for a combination of a memory array and a selection circuit.

FIG. 6 shows a schematic block diagram of the memory array 10. A plurality of memory cells MC are disposed like a matrix in the memory array 10. The control gates of the memory cells disposed in the same row are connected to a word line WL and the drains of the memory cells disposed in the same column are connected to a bit line BL. The word line WL and the bit line BL are disposed so as to cross each other. The source of each of those memory cells is connected to a common source line (not shown) that has a ground potential. A switch may be provided between this common source and the ground point so as to open the source of each memory cell when in writing.

A sense latch circuit SL is connected to one end of each bit line BL. The sense latch circuit SL is provided with a sense-up function for amplifying the potential of each bit line via a column switch MOSFET Qy to be turned on/off by the Y driver 15, as well as a data retaining function. This sense latch circuit SL is also used to retain write data at the time of writing.

An inverter 13a is connected to one end of each word line WL to which the control gates of the memory cells MC disposed in the same row are connected. The inverter 13a is used as a word driver. This word driver 13a is driven by a high voltage VWD (ex., +10V) supplied as a supply voltage from the power supply circuit 23 when in writing. The word driver 13a applies a high voltage VWD to any selected one of the word lines WL according to the output of the decoder 12 and applies a negative voltage VN to other non-selected word lines WL. At a word line change, the word driver 13a receives a supply voltage Vcc and a ground voltage Vss from the power supply circuit 23 and applies the supply voltage Vcc to any selected one of the word lines WL according to the output of the decoder 12 and applies the ground voltage Vss to other non-selected word lines WL.

In a memory cell MC, when a high voltage is applied to its control gate, its floating gate is charged negatively through an FN tunneling phenomenon, thereby the threshold voltage therein rises. At this time, a bit line connected to a memory cell MC in which the threshold voltage is to be raised (ex., data "1") according to write data is not pre-charged. In other words, the bit line is set to 0V. On the other hand, a bit line BL connected to a memory cell in which the threshold voltage is not to be raised (ex., data "0") is pre-charged to a predetermined potential. Because a negative voltage (−2V) is applied to non-selected word lines, no data is written even in a memory cell connected to a bit line that is not pre-charged. When in writing of data, the source of each selected memory cell is set in the floating state (opened). When in erasing of data, a high negative voltage (ex., −10V) is applied to the selected word line (control gates) and 0V is applied to the bit line BL and the source line SL, thereby the floating gate of each selected memory cell is discharged negatively through an FN tunneling phenomenon, thereby the threshold voltage in the memory cell falls.

While the preferred form of the present invention has been described, it is to be understood that modifications will be apparent to those skilled in the art without departing from the spirit of the invention. For example, while the present invention applies to a switch that transmits/shuts off a voltage received via an external terminal at the time of a test to a word line in the memory array, as well as to the control circuit for controlling the switch in the above embodiment, the present invention may also apply to a switch used to transmit/shut off a voltage received via an external terminal to/from a bit line in the memory array, as well as to/from the control circuit for controlling the switch.

Furthermore, while the system is configured so that commands are inputted to a data I/O terminal (I/O0 to I/On) in the above embodiment, such the commands may be issued by combinations of control signals such as the chip enable signal CE, the out enable signal OE, the write enable signal WE, etc. inputted to the subject chip from external.

Furthermore, while the present invention applies to a flash memory comprised of memory cells, in each of which the floating gate is charged to change the threshold voltage in the above embodiment, the present invention may also apply to an EEPROM comprised of memory cells, in each of which charges are trapped at the face boundary of the insulator film, thereby changing the threshold voltage to store information therein.

As described above, while the present invention achieved by the present inventor et al has applied mainly to a flash memory, which is an application field assumed as the background of the invention, the present invention is not limited only to that; the present invention may also apply to a wide variety of semiconductor memory devices enabled to perform a test by transmitting a high voltage received via an external terminal to the memory array at the time of the test performance.

Hereinafter, the representative one of the effects achieved by the present invention disclosed in this specification will be described briefly.

According to the present invention, the semiconductor memory device, which is provided with a switch used to transmit/shut off a voltage received via an external terminal at the time of a test performance, as well as a control circuit for controlling the switch, performs a test with use of the voltage supplied from external. The semiconductor memory device can thus perform tests consecutively, since the tester is not required to reset the applied voltage during the test. It is thus possible to shorten the test time and reduce the load of the tester. Especially, when the present invention applies to such a non-volatile semiconductor memory device as a flash memory that enables data to be written/erased therein/therefrom electrically, it is possible to shorten the required time for a threshold voltage distribution test that checks the distribution of threshold voltages in memory cells and reduce the load of the tester.

[FIG. 1]
24
24 . . . OSCILLATION CIRCUIT
23 . . . POWER SUPPLY CIRCUIT
50 . . . DISTRIBUTION CIRCUIT
25 . . . DRIVER
21 . . . RELIEF DATA SETTING CIRCUIT (FUSE & LATCH)
11 . . . INPUT BUFFER
26 . . . CONTROL CIRCUIT
27 . . . RESET CIRCUIT
12 . . . DECODER
13 . . . WORD & WELL DRIVER
10 . . . MEMORY ARRAY
18 . . . REDUNDANT ARRAY
15 . . . Y DRIVER
14 . . . Y-GATE & DATA LATCH
19 . . . REDUNDANT YG&DL
16 . . . SENSE AMPLIFIER
22 . . . ROUTER
17 . . . I/O BUFFER
[FIG. 2]
80 . . . CHARGE PUMP
50 . . . DISTRIBUTION CIRCUIT
[FIG. 6
12 . . . DECODER
15 . . . Y DRIVER

What is claimed is:

1. A semiconductor memory device, comprising:
a memory array comprised of a plurality of memory cells, a plurality of selection lines connected to selection terminals of the plurality of memory cells disposed in a first direction, and a plurality of signal lines connected to data input/output terminals of the plurality of memory cells disposed in a second direction, said semiconductor memory device being formed as a semiconductor integrated circuit on a semiconductor chip,
wherein said semiconductor chip is provided with an external terminal in addition to a power supply terminal via which a supply voltage is supplied for the operations of all the circuits disposed thereon, said external terminal being enabled to supply a first voltage to said memory array at the time of a test performance, said first voltage being different from said supply voltage, and
wherein a first switching element is provided at a halfway of a path that transmits said first voltage from said external terminal to said memory array, said first switching element comprised of an N-channel or P-channel MOS transistor.

2. The semiconductor memory device according to claim 1,
wherein said first voltage supplied to said memory array at the time of a test performance from outside of said semiconductor chip is supplied to said selection lines.

3. The semiconductor memory device according to claim 1,
wherein said first voltage supplied to said memory array at the time of a test performance from outside of said semiconductor chip is supplied to said signal lines.

4. The semiconductor memory device according to claim 1,
wherein said memory cells are non-volatile memory elements, each being enabled to store information according to the high/low state of a threshold voltage therein.

5. The semiconductor memory device according to claim 4,
wherein information can be written in each of said memory cells electrically,
wherein said semiconductor chip is provided with a voltage generator that generates a second voltage that is different from said supply voltage,
wherein said semiconductor chip is configured so as to transmit said second voltage generated by said voltage generator to said memory array at the time of writing, and
wherein a second switching element is provided at a halfway of said path that transmits said second voltage to said memory array, said second switching being controlled so as to be turned off when said first switching element is on.

6. The semiconductor memory device according to claim 5,
wherein said device is provided with a third switching element that supplies said supply voltage to said memory array instead of said first voltage when said first switching element is turned off and said second switching element is turned on.

7. The semiconductor memory device according to claim 6,
wherein said voltage generator stops when said third switching element is turned on.

8. The semiconductor memory device according to claim 6,
wherein said device is further provided with switching means enabled to shut off a voltage output from said voltage generator, and
wherein said switching means is turned off when said third switching element is turned on.

9. The semiconductor memory device according to claim 4,
wherein said external terminal enabled to supply said first voltage that is different from said supply voltage outputs a signal denoting whether or not said semiconductor chip is ready to receive an access from external.

10. The semiconductor memory device according to claim 1,
wherein said first switching element is comprised of a MOS transistor structured to withstand high breakdown voltages.

* * * * *